(12) United States Patent
Lavoie

(10) Patent No.: US 8,304,909 B2
(45) Date of Patent: Nov. 6, 2012

(54) IC SOLDER REFLOW METHOD AND MATERIALS

(75) Inventor: Adrien R. Lavoie, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 11/960,363

(22) Filed: Dec. 19, 2007

(65) Prior Publication Data

US 2009/0160055 A1    Jun. 25, 2009

(51) Int. Cl.
*H01L 23/48* (2006.01)
*H01L 23/52* (2006.01)
*H01L 29/40* (2006.01)

(52) U.S. Cl. ........ 257/772; 257/741; 257/751; 257/761; 257/762; 257/774; 257/E21.588

(58) Field of Classification Search .................. 257/772, 257/750, 751, 741, 774, 761, 762, E21.588; 438/632, 646, 698, 760
See application file for complete search history.

(56) References Cited

U.S. PATENT DOCUMENTS

| | | | | |
|---|---|---|---|---|
| 3,461,357 | A * | 8/1969 | Mutter et al. | 257/762 |
| 5,268,072 | A * | 12/1993 | Agarwala et al. | 216/13 |
| 5,629,564 | A * | 5/1997 | Nye et al. | 257/762 |
| 5,939,788 | A * | 8/1999 | McTeer | 257/751 |
| 6,077,780 | A * | 6/2000 | Dubin | 438/687 |
| 6,114,244 | A * | 9/2000 | Hirose et al. | 438/688 |
| 6,204,179 | B1 * | 3/2001 | McTeer | 438/687 |
| 6,229,211 | B1 * | 5/2001 | Kawanoue et al. | 257/751 |
| 6,346,741 | B1 * | 2/2002 | Van Buskirk et al. | 257/664 |
| 6,355,558 | B1 * | 3/2002 | Dixit et al. | 438/642 |
| 6,376,910 | B1 * | 4/2002 | Munoz et al. | 257/741 |
| 6,391,769 | B1 * | 5/2002 | Lee et al. | 438/643 |
| 6,548,898 | B2 * | 4/2003 | Matsuki et al. | 257/746 |
| 6,784,543 | B2 * | 8/2004 | Matsuki et al. | 257/746 |
| 7,135,770 | B2 * | 11/2006 | Nishiyama et al. | 257/734 |
| 7,319,270 | B2 * | 1/2008 | Lian et al. | 257/758 |
| 2001/0024688 | A1 * | 9/2001 | Lee | 427/250 |
| 2002/0185733 | A1 * | 12/2002 | Chow et al. | 257/737 |
| 2003/0087522 | A1 * | 5/2003 | Ngo et al. | 438/660 |
| 2004/0035909 | A1 * | 2/2004 | Yeh et al. | 228/56.3 |
| 2004/0238955 | A1 * | 12/2004 | Homma et al. | 257/737 |
| 2004/0241980 | A1 * | 12/2004 | Yamazaki et al. | 438/632 |
| 2005/0215045 | A1 * | 9/2005 | Rinne et al. | 438/614 |
| 2005/0275096 | A1 * | 12/2005 | Zeng et al. | 257/737 |
| 2006/0035416 | A1 * | 2/2006 | Savastiouk et al. | 438/125 |
| 2006/0091553 | A1 * | 5/2006 | Narizuka et al. | 257/762 |
| 2006/0172444 | A1 * | 8/2006 | Jungnickel et al. | 438/14 |
| 2006/0177999 | A1 * | 8/2006 | Hembree et al. | 438/597 |
| 2006/0231951 | A1 * | 10/2006 | Jan et al. | 257/737 |

(Continued)

FOREIGN PATENT DOCUMENTS

JP    2001093928 A  *  4/2001

*Primary Examiner* — Teresa M Arroyo
(74) *Attorney, Agent, or Firm* — Winkle, PLLC

(57) ABSTRACT

Embodiments of IC manufacture resulting in improved electromigration and gap-fill performance of interconnect conductors are described in this application. Reflow agent materials such as Sn, Al, Mn, Mg, Ag, Au, Zn, Zr, and In may be deposited on an IC substrate, allowing PVD depositing of a Cu layer for gap-fill of interconnect channels in the IC substrate. The Cu layer, along with reflow agent layer, may then be reflowed into the interconnect channels, forming a Cu alloy with improved gap-fill and electromigration performance. Other embodiments are also described.

13 Claims, 1 Drawing Sheet

U.S. PATENT DOCUMENTS

| | | | |
|---|---|---|---|
| 2006/0290002 A1* | 12/2006 | Arana et al. | 257/774 |
| 2007/0029669 A1* | 2/2007 | Stepniak et al. | 257/734 |
| 2007/0045388 A1* | 3/2007 | Farnworth et al. | 228/244 |
| 2007/0045840 A1* | 3/2007 | Varnau | 257/737 |
| 2008/0001290 A1* | 1/2008 | Chou et al. | 257/751 |
| 2008/0006945 A1* | 1/2008 | Lin et al. | 257/758 |
| 2008/0308938 A1* | 12/2008 | Yu | 257/751 |

* cited by examiner

IC SOLDER REFLOW METHOD AND MATERIALS

FIELD

This application relates generally to the manufacturing of integrated circuits (IC). In particular, this application relates to improved conductor path manufacture on ICs using improved deposition and solder reflow methods and materials.

BACKGROUND

Electromigration and complete gap-fill in IC conductor paths are increasingly important issues as the size of the interconnect conductor paths, which may conventionally range from hundreds to tens of microns wide and even smaller, are minimized in size for IC production and design. Electromigration occurs when some of the momentum of a moving electron is transferred to a nearby activated ion. This causes the ion to move from its original position. Over time this force knocks a significant number of atoms far from their original positions. A break or gap can develop in the conducting material, preventing the flow of electricity. In narrow interconnect conductors, such as those linking transistors and other components in IC, this is known as a void or internal failure open circuit. Electromigration can also cause the atoms of a conductor to pile up and drift toward other nearby conductors, creating an unintended electrical connection known as a hillock failure or whisker failure (short circuit). Both of these situations can lead to a malfunction of the circuit. Additionally, the methods conventionally used in creating the interconnect conductors may result in incomplete fill of channels or gaps for the conductors, which can result in decreased reliability and susceptibility to electromigration. Material choice and manufacturing methods also affect electromigration, where the choice of materials and techniques for placing the materials tend to affect resistance to electromigration effects.

BRIEF DESCRIPTION OF THE DRAWINGS

The following description can be better understood in light of Figures, in which.

Figure 1:
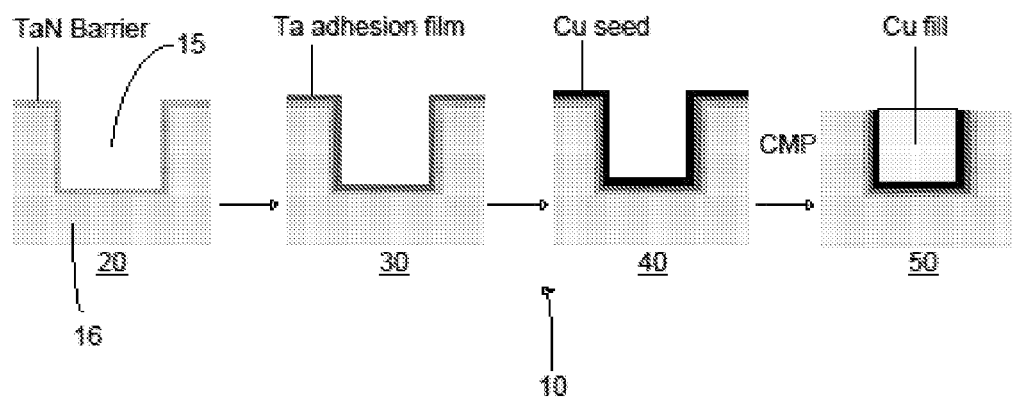
FIG. 1 illustrates a schematic view of a conventional IC interconnect gap-fill process.

Together with the following description, the Figures demonstrate and explain the principles of the apparatus and methods described herein. In the Figures, the thickness and configuration of components may be exaggerated for clarity. The same reference numerals in different Figures represent the same component.

DETAILED DESCRIPTION

The following description supplies specific details in order to provide a thorough understanding. Nevertheless, the skilled artisan would understand that the apparatus, materials, and associated methods can be implemented and used without employing these specific details. Indeed, the apparatus, materials, and associated methods can be placed into practice by modifying the illustrated apparatus, materials and associated methods and can be used in conjunction with any apparatus and techniques conventionally used in the industry. For example, embodiments of the apparatus, materials, and associated methods may be used in any application using solder, reflow, IC manufacture, etc., or any application where electromigration may be problematic.

FIG. 1 illustrates a conventional process 10 for creating interconnect conductors in an IC. Conventionally, a TaN barrier is deposited onto an IC substrate using PVD 20, a Ta adhesion film is then deposited on the TaN barrier using PVD 30, a continuous Cu seed layer is deposited using PVD 40, Cu is placed in interconnect channels 15 for interconnect conductors using electroplating (EP), and the entire surface of the IC 16 is processed using chemical-mechanical planarization (CMP). CMP removes the barrier layer, Ta adhesion film, and Cu seed layers on the top surface of the IC substrate. The conventional process is inconsistent by producing a relatively high amount of voids in gap-fill of interconnect channels 15. As the number of interconnect channels 15 increases and the width of interconnect channels 15 decreases as the complexity of ICs increases, the percentage of failing ICs increases, causing increasing inefficiencies in conventional IC manufacturing processes, as well as increased potential for electromigration in interconnect channels 15 having voids that may not be detected during manufacture.

Figure 2:
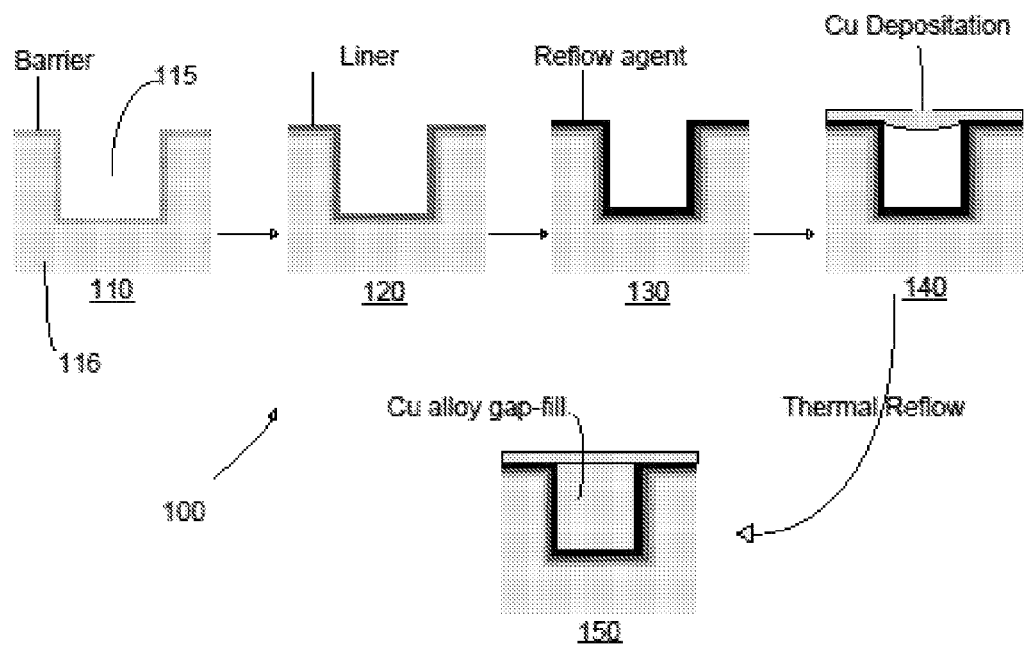
FIG. 2 illustrates a schematic view of an exemplary embodiment of an IC interconnect gap-fill process.

FIG. 2 illustrates an embodiment of a process 100 for creating interconnect conductors in an IC that produces better quality ICs having fewer voids and less susceptibility to electromigration than ICs produced conventionally. Process 100 may include: step 110, depositing a barrier layer on IC substrate 116; step 120, depositing a liner layer on the barrier layer; step 130, depositing a reflow agent layer on the liner layer; step 140, depositing a Cu layer on the reflow agent layer; and step 150, thermally reflowing at least the Cu and reflow agent layer to fill interconnect channels 115. The barrier layer may be any suitable barrier layer, such as TaN. The liner layer may be one of Ta, Ru, Ir, Os, Rh, Co, and Ni. The reflow agent layer may be one of Sn, Al, Mn, Mg, Ag, Au, Zn, Zr, and In. Each of the layers, including the Cu layer may be deposited using PVD, metal evaporation, electron beam physical vapor deposition, sputter deposition, pulsed laser deposition, chemical vapor deposition, atomic layer deposition, electroless deposition, electrochemical deposition etc.

As shown in FIG. 2, step 140 may result in Cu resting on top of interconnect channels 115 without significantly filling interconnect channels 115 prior to step 150. Step 150 may include preheating substrate 116 and the layers as shown in step 140 to about 75 to 350 degrees C. As substrate 116 is heated the solder agent begins to reflow, thus increasing Cu mobility. An added benefit is that the solder agent may getter impurities, such as C, N, O, from the layers. The resulting purification may then lead to an increased wetting of the Cu layer and the liner and/or barrier layer to produce decreased surface potential of the dissimilar materials, followed by the onset of Cu alloy formation and reflow. The increased Cu mobility results in Cu and Cu alloy movement into the patterned structures thus resulting in gapfill.

The Cu alloy formation may include at least some of the reflow agent layer, and may also include some material from the liner layer. The resulting Cu alloy solder may then reflow to fill interconnect channels 115 once the solder has sufficient thermally supplied activation energy to sufficiently wet the Cu and the barrier and/or liner layers. At a peak reflow temperature, which may be well above the melting point of the reflow agent and Cu alloy, interconnect channels 115 may be completely filled leaving no voids. Substrate 116 may then be cooled gradually such that film stress is dissipated and delamination is limited.

Embodiments such as process 100 may result in improved gap-fill with little or no voids in interconnect channels 115. In such embodiments, interconnect channels 115 may be less than about 30 nm wide, and may be any width desired by one of ordinary skill. Additionally, the use of the reflow agent layer and resulting Cu alloy may result in improved electromigration resistance and the elimination of a need for continuous Cu seeding without pinch-off or overhang as an enabler of void-free gap-fill. Similarly, some embodiments may result in reduced steps since reflow step 150 may improve both gap-fill and electromigration performance in a single step 150. For example, a CMP step may not be required because of the resulting reflow surface.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A device, comprising:
   a substrate,
   a barrier layer deposited on the substrate, the substrate having surface channels, wherein the surface channels have a width of less than 30 nm;
   a liner layer deposited on the barrier layer;
   a reflow agent layer being primarily a metallic element deposited on the liner layer, wherein the metallic element of the reflow agent layer is one of Sn, Mn, Mg, Ag, Au, Zn, Zr, or In;
   a Cu alloy completely filling the surface channels such that the surface channels are free from voids, wherein the Cu alloy includes at least Cu and at least the metallic element from the reflow agent layer.

2. The device of claim 1, wherein the substrate is a semiconductor substrate.

3. The device of claim 1, wherein the Cu alloy is created by depositing Cu of the reflow agent layer by PVD and heating the substrate sufficient to reflow the Cu and the reflow agent.

4. The device of claim 1, wherein the barrier layer, the liner layer and the reflow agent layer are deposited using PVD.

5. The device of claim 1, wherein the barrier layer is primarily TaN.

6. The device of claim 5, wherein the liner layer is primarily one of Ta, Ru, Ir, Os, Rh, Co, or Ni.

7. The device of claim 1, wherein the surface channels have side walls extending from a top of the surface channels to a bottom of the surface channels, and wherein the barrier layer is on the side walls from the top of the surface channels to the bottom of the surface channels as well as on the bottom of the surface channels.

8. The device of claim 1, wherein the surface channels have side walls extending from a top of the surface channels to a bottom of the surface channels, and wherein the reflow agent layer is on the side walls from the top of the surface channels to the bottom of the surface channels as well as on the bottom of the surface channels.

9. The device of claim 1, wherein the barrier layer, the liner layer, and the reflow agent layer are conformally deposited to substantially coat side walls and bottoms of the surface channels.

10. The device of claim 1, wherein the Cu alloy does not directly contact the substrate in the surface channels.

11. An interconnect conductor, comprising:
    a substrate having interconnect channels with side walls and bottoms, wherein the interconnect channels have a width of less than 30 nm;
    a barrier layer on the side walls and bottoms of the interconnect channels;
    a liner layer on the side walls and bottoms of the interconnect channels, the barrier layer being between the liner layer and the side walls and bottoms of the interconnect channels;
    a reflow agent layer being primarily a metallic element on the side walls and bottoms of the interconnect channels, the liner layer and the barrier layer being between the reflow agent layer and the side walls and bottoms of the interconnect channels, wherein the metallic element of the reflow agent layer is one of Sn, Mn, Mg, Ag, Au, Zn, Zr, or In; and
    a Cu alloy completely filling the interconnect channels, the reflow agent layer, the liner layer and the barrier layer being between the Cu alloy and the side walls and bottoms of the interconnect channels, wherein the Cu alloy comprises both Cu and the metallic element from the reflow agent layer.

12. The interconnect conductor of claim 11, wherein the barrier layer consists substantially of TaN.

13. The interconnect conductor of claim 11, wherein the liner layer consists substantially an element selected from the group consisting of Ta, Ru, Ir, Os, Rh, Co, or Ni.

* * * * *